United States Patent
Lee et al.

(10) Patent No.: US 9,082,795 B2
(45) Date of Patent: Jul. 14, 2015

(54) PRECURSOR COMPOSITION OF OXIDE SEMICONDUCTOR AND THIN FILM TRANSISTOR SUBSTRATE INCLUDING OXIDE SEMICONDUCTOR

(71) Applicant: SAMSUNG DISPLAY CO., LTD., Yongin-City, Gyeonggi-Do (KR)

(72) Inventors: Doo Hyoung Lee, Suwon-si (KR); Chan Woo Yang, Siheung-si (KR); Seung-Ho Jung, Yongin-si (KR); Doo Na Kim, Seongnam-si (KR); Bo Sung Kim, Seoul (KR); Eun Hye Park, Incheon (KR); June Whan Choi, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/477,587

(22) Filed: Sep. 4, 2014

(65) Prior Publication Data
US 2014/0377904 A1    Dec. 25, 2014

Related U.S. Application Data

(62) Division of application No. 13/679,910, filed on Nov. 16, 2012, now Pat. No. 8,853,687.

(30) Foreign Application Priority Data

Jun. 8, 2012  (KR) .................. 10-2012-0061457

(51) Int. Cl.
*H01L 29/786* (2006.01)
*H01L 21/336* (2006.01)
(Continued)

(52) U.S. Cl.
CPC ............ *H01L 29/66969* (2013.01); *H01B 1/06* (2013.01); *H01L 21/02565* (2013.01); *H01L 21/02628* (2013.01); *H01L 29/7869* (2013.01)

(58) Field of Classification Search
CPC ............... H01L 21/02565; H01L 21/02628; H01L 27/1222; H01L 27/1225; H01L 29/66969; H01L 29/7869
See application file for complete search history.

(56) References Cited

U.S. PATENT DOCUMENTS 5,986,301 A   11/1999  Fukushima et al.
6,534,183 B1   3/2003  Inoue
(Continued)

FOREIGN PATENT DOCUMENTS

JP    2009-158443    7/2009
JP    2011-003456    1/2011
(Continued)

*Primary Examiner* — Mary Wilczewski
*Assistant Examiner* — Toniae Thomas
(74) *Attorney, Agent, or Firm* — Innovation Counsel LLP

(57) ABSTRACT

A thin film transistor substrate according to an exemplary embodiment of the present invention includes a semiconductor layer including metal disposed on an insulating substrate, a gate electrode overlapping the semiconductor layer, and a source electrode and a drain electrode overlapping the semiconductor layer, wherein the metal in the semiconductor layer comprises indium (In), zinc (Zn), and tin (Sn), and a molar ratio $$\left(R, R[\text{mol }\%] = \frac{[In]}{[In+Zn+Sn]} \times 100\right)$$

of indium (In) to the metals in the semiconductor layer is less than about 20%, and more specifically, the molar ratio $$\left(R, R[\text{mol }\%] = \frac{[In]}{[In+Zn+Sn]} \times 100\right)$$

of indium (In) of the metals in the semiconductor layer is about 5% to about 13%.

8 Claims, 8 Drawing Sheets

(51) Int. Cl.
*H01L 29/66* (2006.01)
*H01B 1/06* (2006.01)
*H01L 21/02* (2006.01)

(56) References Cited

U.S. PATENT DOCUMENTS

| | | |
|---|---|---|
| 7,893,431 B2 | 2/2011 | Kim et al. |
| 7,947,537 B2 | 5/2011 | Honda et al. |
| 8,058,645 B2 | 11/2011 | Jeong et al. |
| 8,084,307 B2 | 12/2011 | Itagaki et al. |
| 8,222,158 B2 | 7/2012 | Mochizuki et al. |
| 8,405,071 B2 | 3/2013 | Park et al. |
| 8,597,992 B2 | 12/2013 | Sasagawa et al. |
| 8,623,511 B2 | 1/2014 | Kawashima et al. |
| 2001/0010377 A1 | 8/2001 | Cuchiaro et al. |
| 2007/0184576 A1 | 8/2007 | Chang et al. |
| 2010/0184253 A1 | 7/2010 | Hirai et al. |
| 2011/0240988 A1* | 10/2011 | Yano et al. .................. 257/43 |
| 2011/0260121 A1* | 10/2011 | Yano et al. .............. 252/519.51 |
| 2012/0014157 A1* | 1/2012 | Kato et al. ..................... 365/72 |
| 2012/0244667 A1 | 9/2012 | Kim et al. |
| 2013/0200345 A1 | 8/2013 | Usta et al. |

FOREIGN PATENT DOCUMENTS

| | | |
|---|---|---|
| KR | 10-2011-0041116 | 4/2011 |
| KR | 10-1043854 | 6/2011 |
| KR | 10-2011-0107130 | 9/2011 |
| KR | 10-1069613 | 9/2011 |
| KR | 10-1096740 | 12/2011 |

* cited by examiner

PRECURSOR COMPOSITION OF OXIDE SEMICONDUCTOR AND THIN FILM TRANSISTOR SUBSTRATE INCLUDING OXIDE SEMICONDUCTOR

CROSS-REFERENCE TO RELATED APPLICATION

This application is a divisional application of U.S. patent application Ser. No. 13/679,910 filed on Nov. 16, 2012, which claims priority to Korean Patent Application No. 10-2012-0061457 filed in the Korean Intellectual Property Office on Jun. 8, 2012, and all the benefits accruing therefrom under 35 U.S.C. §119, the contents of the prior applications being herein incorporated by reference.

BACKGROUND OF THE INVENTION (a) Field of the Invention

The present invention relates to a precursor composition of an oxide semiconductor, a thin film transistor substrate including the oxide semiconductor, and a method of manufacturing the thin film transistor substrate including the oxide semiconductor.

(b) Description of the Related Art

A liquid crystal display is currently one of the most widely used flat panel displays, and a device that includes two substrates on which electrodes are formed and a liquid crystal layer interposed therebetween, and controls the intensity of transmitted light to display an image by rearranging the liquid crystal molecules of the liquid crystal layer by applying voltage to the electrodes.

In general, the liquid crystal display includes a thin film transistor for switching a pixel. The thin film transistor includes a gate electrode receiving a switching signal, a source electrode to which data voltage is applied, and a drain electrode outputting a data electrode as three terminals to constitute a switching element. Further, the thin film transistor includes an active layer overlapping the gate electrode, the source electrode and the drain electrode as a channel layer, and the active layer mainly uses amorphous silicon as a semiconductor material.

However, in accordance with enlargement of the display, there is an urgent need for developing a thin film transistor that can be driven at ultra-high speed. Particularly, amorphous silicon that is currently used as the active layer has low electron mobility and requires costly vacuum process-based deposition equipments for applying a chemical vapor deposition (CVD), a sputtering method or the like.

Accordingly, there is a need to develop an oxide semiconductor material having high electron mobility and capable of being subjected to a solution process in order to be performed through a coating process or a ultra low-priced printing process. However, heat treatment is required at a high temperature of 400° C. or more in order to form the oxide semiconductor by the solution process, and energy consumption is large. Further, since a costly additive is added to a precursor of the oxide semiconductor for the low temperature process, it is difficult to reduce cost.

Meanwhile, there is a need for developing a thin film transistor substrate that can be used in a flexible display device such as electronic paper and can be formed by the low temperature process.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a thin film transistor substrate formed by a low temperature process without a costly additive to have a thin film transistor characteristic, and a method of manufacturing the thin film transistor substrate.

An exemplary embodiment of the present invention provides a precursor composition of an oxide semiconductor including a metal compound represented by the following Formula 1, $$MX_n \qquad \text{Formula 1}$$

wherein M is the metal ion and comprises indium (In), zinc (Zn), and tin (Sn), X is an organic or inorganic negative ion, n is a natural number, and a molar ratio $$\left(R, R[\text{mol }\%] = \frac{[In]}{[In + Zn + Sn]} \times 100\right)$$

of indium (In) to the metals in the precursor composition of the oxide semiconductor is about 5% to about 13%.

The negative ion may include at least one of acetate, halide, nitrate and perchlorate.

Another exemplary embodiment of the present invention provides a thin film transistor substrate including: a semiconductor layer including metal disposed on an insulating substrate, a gate electrode overlapping the semiconductor layer, and a source electrode and a drain electrode overlapping the semiconductor layer, wherein the metal in the semiconductor layer comprises indium (In), zinc (Zn), and tin (Sn), and a molar ratio $$\left(R, R[\text{mol }\%] = \frac{[In]}{[In + Zn + Sn]} \times 100\right)$$

of indium (In) to the metals in the semiconductor layer is about 5% to about 13%.

The substrate may be flexible.

The substrate may include a plastic.

The thin film transistor substrate may further include a gate line connected to the gate electrode, a data line connected to the source electrode, and a pixel electrode connected to the drain electrode.

Yet another exemplary embodiment of the present invention provides a method of manufacturing a thin film transistor substrate, including: preparing a precursor composition solution of an oxide semiconductor including a precursor composition of the oxide semiconductor and a solvent, applying the precursor composition solution of the oxide semiconductor to a substrate, and heat treating the applied precursor composition solution of the oxide semiconductor, wherein the metal in the precursor composition solution of the oxide semiconductor comprises indium (In), zinc (Zn), and tin (Sn), and a molar ratio $$\left(R, R[\text{mol \%}] = \frac{[In]}{[In + Zn + Sn]} \times 100\right)$$

of indium (In) of the metals in the metal compound solution is about 5% to about 13%.

The heat treating may be performed at about 100° C. to about 300° C.

The heat treating may be performed at about 100° C. to about 250° C.

The substrate may be flexible.

The substrate may include a plastic.

The method of manufacturing the thin film transistor substrate may further include: patterning the heat treated precursor composition of the oxide semiconductor to form an oxide semiconductor pattern, forming a gate electrode overlapping the semiconductor pattern, and forming a source electrode and a drain electrode on the substrate.

The forming of the gate electrode forms a gate line connected to the gate electrode simultaneously, and the forming of the source electrode and the drain electrode forms a data line connected to the source electrode simultaneously, and the forming of the thin film transistor substrate may further include forming a pixel electrode electrically connected to the drain electrode.

A total molar concentration of the metals in the precursor composition solution of the oxide semiconductor may be about 0.05M to about 1.0M.

According to the exemplary embodiments of the present invention, it is possible to provide a thin film transistor substrate formed without a costly additive by a low temperature process to have a thin film transistor characteristic by forming an oxide semiconductor including metal of indium (In), zinc (Zn), and tin (Sn) and controlling a ratio of indium in the oxide semiconductor, and a method of manufacturing the same.

DETAILED DESCRIPTION OF THE EMBODIMENTS

Figure 1:
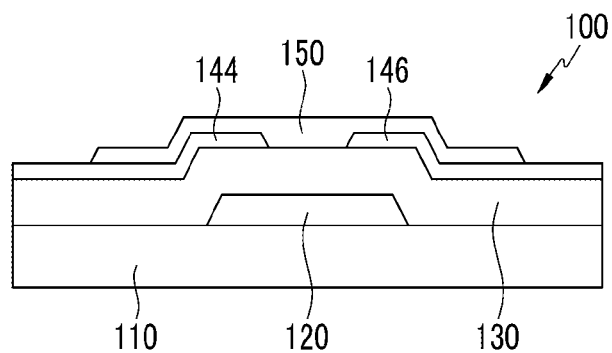
FIG. 1 is a cross-sectional view of a thin film transistor substrate according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

FIG. 1 is a cross-sectional view of a thin film transistor substrate according to an exemplary embodiment of the present invention.

Referring to FIG. 1, a thin film transistor array panel 100 includes an insulating substrate 110, a gate electrode 120, a gate insulating layer 130, a source electrode 144, a drain electrode 146 and an oxide semiconductor layer 150.

The insulating substrate 110 may be a plastic. The gate electrode 120 is disposed on the insulating substrate 110. The gate electrode 120 may be connected to a gate wire through which a gate signal is transmitted. The gate electrode 120 may include an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chromium (Cr), tantalum (Ta), titanium (Ti) and the like.

Further, the gate electrode 120 may have a multilayered structure including two conductive layers (not shown) having different physical properties. One conductive layer of the conductive layers may be formed of metal having low resistivity, for example, the aluminum-based metal, the silver-based metal, the copper-based metal and the like, so as to reduce a signal delay or a voltage drop, and the other conductive layer may be formed of other materials, particularly a material having an excellent contact characteristic with zinc oxide (ZnO), ITO (indium tin oxide) and IZO (indium zinc oxide), for example, the molybdenum-based metal, chromium, titanium, tantalum and the like. Good examples of the combination may include a chromium lower layer and an aluminum upper layer, an aluminum lower layer and a molybdenum upper layer, or a titanium lower layer and a copper upper layer.

However, the gate electrode 120 according to the exemplary embodiment of the present invention is not limited thereto, and may be made of various other metals and conductors.

The gate insulating layer 130 is formed on the insulating substrate 110 and the gate wire including the gate electrode 120. The gate insulating layer 130 may be formed of silicon oxide (SiOx), silicon nitride (SiNx), silicon oxynitride (SiON) or the like. Further, the gate insulating layer 130 may have a multilayered structure where silicon oxide and silicon nitride are laminated. In this case, the silicon nitride layer may be formed on the upper portion of the insulating substrate 110, and the silicon oxide layer may be formed on the upper portion of the silicon nitride layer to bring the silicon oxide layer into contact with an oxide semiconductor layer to be described later.

In the case where a silicon oxynitride single layer is used, the oxygen concentration distribution may be such that a compositional ratio of oxygen is increased in the silicon oxynitride as the silicon oxynitride layer becomes closer to the oxide semiconductor layer In the case where the oxide semiconductor layer comes into contact with the silicon oxide layer, an oxygen deficiency concentration in the oxide semiconductor may be maintained at a constant level to prevent degradation of the channel layer.

The source electrode 144 and the drain electrode 146 are disposed on the gate insulating layer 130. The source electrode 144 may be connected to a data wire through which a data signal is transmitted.

The oxide semiconductor layer 150 is disposed on the source electrode 144 and the drain electrode 146.

Although not shown in the drawings, a protection layer may be disposed on the oxide semiconductor layer 150.

In the present exemplary embodiment, the gate electrode 120, the gate insulating layer 130, the source electrode 144, the drain electrode 146 and the oxide semiconductor layer 150 are sequentially deposited. However, the present invention is not limited thereto, and a structure of the thin film transistor may be different therefrom.

The source electrode 144 and the drain electrode 146 are spaced apart from each other, and at least partially overlap the oxide semiconductor layer 150. That is, the source electrode 144 at least partially overlaps the oxide semiconductor layer 150, and the drain electrode 146 is disposed to face the source electrode 144 with a channel portion of the oxide thin film transistor as the center therebetween so as to at least partially overlap the oxide semiconductor layer 150.

The source electrode 144 and the drain electrode 146 may be formed of a material coming into direct contact with the oxide semiconductor layer 150 to form an ohmic contact. For example, in the case where the material forming the source electrode 144 and the drain electrode 146 has a work function that is smaller than that of the material forming the oxide semiconductor layer 150, the ohmic contact may be implemented. However, unlike this, an ohmic contact layer (not shown) formed in only a region where the source electrode 144, the drain electrode 146 and the oxide semiconductor layer 150 overlap may be further included. The ohmic contact layer helps to implement the ohmic contact.

The source electrode 144 and the drain electrode 146, like the gate electrode 120, may include an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chromium (Cr), tantalum (Ta), titanium (Ti) and the like. Further, the source electrode 144 and the drain electrode 146 may be formed of a transparent conductive material such as zinc oxide (ZnO), ITO (indium tin oxide) and IZO (indium zinc oxide).

Further, the data wire may have a multilayered structure including different conductive layers (not shown), and examples of the combination may include a double layer such as Mo (Mo alloy)/Al (Al alloy), Ti (Ti alloy)/Al (Al alloy), Ta (Ta alloy)/Al (Al alloy), Ni (Ni alloy)/Al (Al alloy), Co (Co alloy)/Al (Al alloy), Ti (Ti alloy)/Cu (Cu alloy) or Cu (Cu alloy)/Mn (Mn alloy), a triple layer such as Ti (Ti alloy)/Al (Al alloy)/Ti (Ti alloy), Ta (Ta alloy)/Al (Al alloy)/Ta (Ta alloy), Ti (Ti alloy)/Al (Al alloy)/TiN, Ta (Ta alloy)/Al (Al alloy)/TaN, Ni (Ni alloy)/Al (Al alloy)/Ni (Ni alloy), Co (Co alloy)/Al (Al alloy)/Co (Co alloy) or Mo (Mo alloy)/Al (Al alloy)/Mo (Mo alloy) or the like.

However, the source electrode 144 and the drain electrode 146 according to the exemplary embodiment of the present invention are not limited thereto, and may be made of various other metals and conductors.

The drain electrode 146 may be electrically connected to a pixel electrode (not shown), an electric field is formed by a voltage applied to the pixel electrode and an opposed electrode (not shown), and a gray display can be obtained according to the electric field.

The oxide semiconductor layer 150 including metal oxide is formed on the source electrode 144 and the drain electrode 146. The oxide semiconductor layer 150 may include metal. The oxide semiconductor layer 150 overlaps the gate electrode 120. The gate insulating layer 130, the source electrode 144 and the drain electrode 146 are disposed between the oxide semiconductor layer 150 and the gate electrode 120.

The oxide semiconductor layer 150 is formed by applying a metal compound solution including the precursor composition of the oxide semiconductor represented by the following Formula 1 and the solvent and then performing heat treatment.

$$MX_n \qquad \text{Formula 1}$$

Herein, M is a metal positive ion, X is various organic or inorganic negative ions, and n is a natural number.

X is a negative ion, and examples thereof include acetate ($CH_3COO$), halide, nitrate, perchlorate and the like.

Metal of the precursor composition of the oxide semiconductor layer 150 may be formed of indium (In), zinc (Zn), and tin (Sn). Further, a molar ratio of indium (In) of the metals in the precursor composition of the oxide semiconductor layer 150 is as follows.

In $$R[\text{mol }\%] = \frac{[In]}{[In + Zn + Sn]} \times 100,$$

R is less than about 20%, and more specifically about 5.0% to about 13.0%.

That is, the metal of the oxide semiconductor layer 150 comprises indium (In), zinc (Zn), and tin (Sn), and the molar ratio of indium (In) to the metal of indium (In), zinc (Zn), and tin (Sn) in the oxide semiconductor layer 150 is about 5.0% to about 13.0%.

Meanwhile, although not shown in the drawings, a passivation layer may be disposed on an upper portion of the oxide semiconductor layer 150. The passivation layer may use a multilayer where silicon oxide ($SiO_x$) and silicon nitride ($SiN_x$) are laminated, and the silicon oxide ($SiO_x$) layer may come into contact with the oxide semiconductor layer 150 to prevent degradation of the channel layer.

Figure 2:
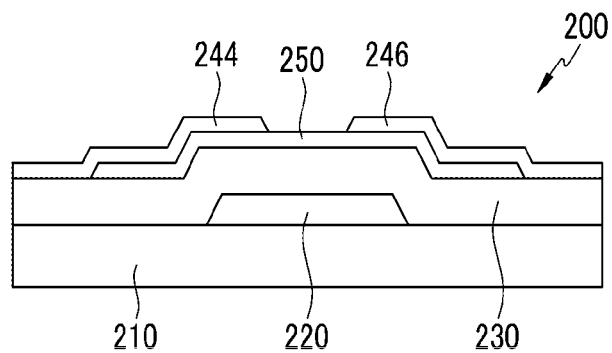
FIG. 2 is a cross-sectional view of a thin film transistor substrate according to another exemplary embodiment of the present invention.

Hereinafter, referring to FIG. 2, another exemplary embodiment of the present invention will be described. FIG. 2 is a cross-sectional view of a thin film transistor array panel according to another exemplary embodiment of the present invention.

Referring to FIG. 2, a thin film transistor substrate 200 includes an insulating substrate 210, a gate electrode 220, a gate insulating layer 230, a source electrode 244, a drain electrode 246 and an oxide semiconductor layer 250.

The gate electrode 220 that is a portion of a gate wire through which a gate signal is transmitted is disposed on the insulating substrate 210. The gate insulating layer 230 is disposed on the insulating substrate 210 and the gate electrode 220. The oxide semiconductor layer 250 overlapping the gate electrode 220 is disposed on the gate insulating layer 230. The source electrode 244 and the drain electrode 246 are disposed on the oxide semiconductor layer 250. The source electrode 244 and the drain electrode 246 are formed so as to at least partially overlap the oxide semiconductor layer 250 and be spaced apart from each other. That is, the oxide semiconductor layer 250 is disposed between the gate insulating layer 230 and the source electrode 244 and the drain electrode 246. A passivation layer (not shown) including the silicon oxide layer may be disposed on the source electrode 244 and the drain electrode 246.

The oxide semiconductor layer 250 is formed by applying a metal compound solution including the precursor composition of the oxide semiconductor represented by the following Formula 1 and the solvent and then performing heat treatment.

MXn                Formula 1

Herein, M is a metal positive ion, X is various organic or inorganic negative ions, and n is a natural number.

X is various negative ions, and examples thereof include acetate ($CH_3COO$), halide, nitrate, perchlorate and the like.

Metal of the precursor composition of the oxide semiconductor layer 250 may be formed of indium (In), zinc (Zn), and tin (Sn). Further, a molar ratio (R) of indium (In) to the metals in the precursor composition of the oxide semiconductor layer 150 is as follows.

$$R[\text{mol \%}] = \frac{[In]}{[In + Zn + Sn]} \times 100,$$

R is less than about 20%, and more specifically about 5.0% to about 13.0%.

That is, the metal of the oxide semiconductor layer 250 comprises indium (In), zinc (Zn), and tin (Sn), and the molar ratio of indium (In) to the metal of indium (In), zinc (Zn), and tin (Sn) in the oxide semiconductor layer 250 is about 5.0% to about 13.0%.

In the aforementioned exemplary embodiments, a bottom gate structure where the gate electrode is disposed under the oxide semiconductor layer is described, but the present invention is not limited thereto, and may be applied to a top gate structure where the gate electrode is disposed on the oxide semiconductor layer.

Figure 3:
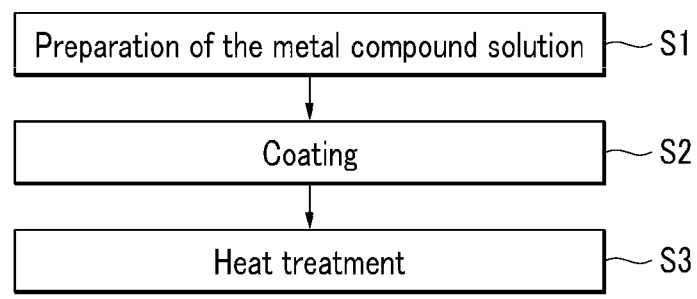
FIG. 3 is a flowchart illustrating a method of manufacturing an oxide semiconductor included in the thin film transistor substrate according to the exemplary embodiment of the present invention.

Then, referring to FIG. 3, a method of manufacturing the thin film transistor array panel according to the exemplary embodiment of the present invention will be described. FIG. 3 is a flowchart illustrating a method of manufacturing an oxide semiconductor included in the thin film transistor substrate according to the exemplary embodiment of the present invention.

Referring to FIG. 3, the method of manufacturing the thin film transistor substrate according to the present exemplary embodiment includes preparing a metal compound solution including a metal ionic salt compound and a solvent (S1), applying the metal compound solution on the substrate (S2), and heat treating the metal compound solution (S3).

First, in preparing the metal compound solution (S1), the precursor composition of the oxide semiconductor represented by the following Formula 1 and the solvent are mixed with each other.

MXn                Formula 1

Herein, M is a metal positive ion, X is various organic or inorganic negative ions, and n is a natural number.

M is the metal positive ion and comprises indium (In), zinc (Zn), and tin (Sn), and X is various negative ions and may include at least one of acetate, halide, nitrate, perchlorate and the like.

In this case, metal in the precursor composition of the oxide semiconductor comprises indium (In), zinc (Zn), and tin (Sn). Further, a molar ratio (R) of indium (In) to the metals in the precursor composition of the oxide semiconductor is as follows.

$$R[\text{mol \%}] = \frac{[In]}{[In + Zn + Sn]} \times 100,$$

R is less than about 20%, and more specifically about 5.0% to about 13.0%.

Further, a total molar concentration range of the metals in the precursor composition solution of the oxide semiconductor may be about 0.05 M to about 1.0 M. However, the total molar concentration range of the metal in the metal ionic salt compound solution is not limited to any value.

If the total molar concentration range of metal in the metal ionic salt compound solution is less than 0.05 M, the amount of metal in the oxide semiconductor layer may not be sufficient for the oxide semiconductor layer to act as the channel layer. If the total molar concentration range of metal in the metal ionic salt compound solution is more than 1.0 M, the high concentration of metal in the metal ionic salt compound solution may cause the oxide semiconductor layer to act as a a conductive layer instead of a semiconductor.

However, this concentration range may be changed according to solubility of metal and solubility of metal may be changed according to a change in temperature, pressure, or solvent.

Next, the prepared metal compound solution is applied on the substrate (S2). In this case, the gate electrode, the gate insulating layer, the source electrode and the drain electrode may be formed on the substrate, or the gate electrode and the gate insulating layer may be formed on the substrate. However, the present invention is not limited thereto, and the structure included in the substrate may be changed according to the structure of a thin film transistor to be manufacture.

The applying of the metal compound solution on the substrate (S2) may be achieved with any of spin coating, dip coating, bar coating, screen printing, slide coating, roll coating, spray coating, slot coating, dip-pen, ink jet and nano dispensing.

Next, the substrate coated with the metal compound solution is heat treated (S3). In this case, heat treatment may be performed at about 100° C. to about 300° C., and more specifically at about 100° C. and 250° C.

In the case where the temperature of heat treatment is lower than 100° C., since metal oxide is not smoothly formed, the formed oxide semiconductor layer does not act as the channel layer of the thin film transistor. Further, in the case where the temperature of heat treatment is higher than about 300° C., since the temperature is likely to be higher than the heat resistant temperature limit of the plastic substrate, the plastic substrate cannot be used.

The solvent of the metal compound solution is removed and the oxide semiconductor layer including metal oxide is formed by performing the heat treatment (S3).

Although not shown in the drawings, a process of forming a semiconductor pattern having a desired shape by etching the oxide semiconductor layer after the heat treatment step (S3) may be performed. In etching the oxide semiconductor layer, the etching may be performed by various methods (dry etching, wet etching and the like). For example, the desired pattern may be formed by laminating a photosensitive film on the oxide semiconductor layer, exposing and developing the photosensitive film by a mask or the like to form a predetermined pattern, and providing an etchant based on the patterned photosensitive film to perform wet etching.

Further, although not shown in the drawings, forming a gate electrode overlapping the semiconductor pattern, and forming a source electrode and a drain electrode overlapping the semiconductor pattern and spaced apart from each other may be further included. In addition, the gate line connected to the gate electrode may be formed together with the gate electrode in forming the gate electrode, and the data line connected to the source electrode may be formed together with the source electrode and the drain electrode in forming the source electrode and the drain electrode. Furthermore, although not shown in the drawings, forming a pixel electrode electrically connected to the drain electrode may be further included.

Hereinafter, performance of the thin film transistor substrate according to the exemplary embodiment of the present invention will be described through the Experimental Examples. However, the following Experimental Examples are set forth to illustrate the present invention, and the scope of the present invention is not limited thereto.

EXPERIMENTAL EXAMPLE 1

In the present Experimental Example, the thin film transistor including the semiconductor formed by dissolving the following metal ionic salt compound in the methoxyethanol solvent and applying the resulting material was formed.

$$InCl_3 + Zn(NO_3)_6H_2O + SnCl_2$$

In this case, the molar ratio (R) of indium (In) of metals in the metal ionic salt compound was about 10%.

Herein, R is as follows.

$$R[\text{mol }\%] = \frac{[In]}{[In + Zn + Sn]} \times 100$$

When the semiconductor was formed, annealing was performed at about 250° C. for about one hour to accomplish heat treatment.

Figure 4:
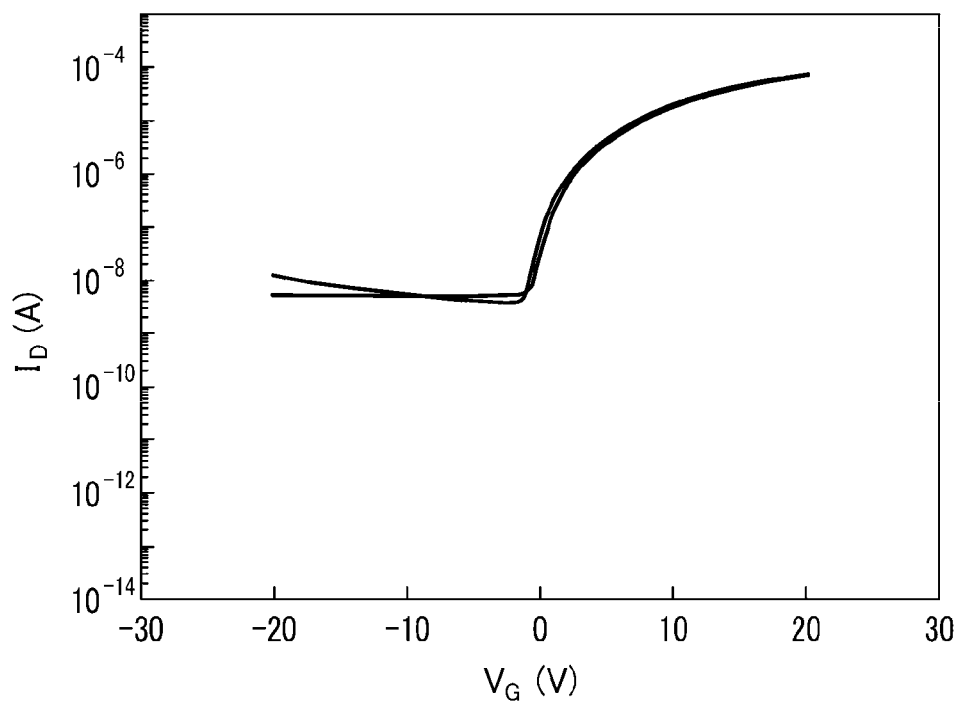
FIG. 4 is a graph illustrating a transfer curve of a thin film transistor according to an Experimental Example of the present invention.

Characteristics of the semiconductor thusly formed were measured, and the results thereof are shown in FIG. 4. FIG. 4 is a graph illustrating a transfer curve of a thin film transistor according to an Experimental Example of the present invention. The value of the current (Id) flowing through the semiconductor layer formed in the present Experimental Example according to application of the gate voltage (Vg) was measured and shown in the graph of FIG. 4. In this case, charge mobility was about 4.027 cm²/Vs.

Referring to FIG. 4, like the thin film transistor substrate according to the exemplary embodiment of the present invention, it could be seen that the metal in the oxide semiconductor was formed of indium (In), zinc (Zn), and tin (Sn), and the on-current of about 1.0 E-4 was obtained and the on-off current ratio of about $2.0\times10^4$ was obtained by controlling the ratio of indium (In) in the metal of the semiconductor. The amount of charge flowing on the surface of the semiconductor was large because the semiconductor layer was not patterned in the present Experimental Example, but if the semiconductor layer is patterned in a predetermined size to form the semiconductor pattern, the amount of charge flowing on the surface of the semiconductor is reduced, and the value of the off-current is further reduced, such that the on-off current ratio can have a value of about $10^7$ or more.

Likewise, it could be seen that it was possible to the thin film transistor having the excellent switching characteristic by forming the metal in the oxide semiconductor by indium (In), zinc (Zn), and tin (Sn) and controlling the ratio of indium (In) in the metal of the semiconductor like the thin film transistor substrate according to the exemplary embodiment of the present invention.

Further, according to the thin film transistor substrate and the method of manufacturing the thin film transistor substrate according to the exemplary embodiment of the present invention, since the metal ionic salt compound is mixed with the solvent without an additive when the semiconductor is formed, it is not difficult to select the material and a cost is not high.

EXPERIMENTAL EXAMPLE 2

In the present Experimental Example, the metal ionic salt compound shown in Experimental Example 1 was dissolved in the solvent shown in Experimental Example 1, applied, and heat treated by annealing at about 250° C. for about one hour to form the semiconductor layer.

In this case, other conditions were the same, the molar ratio (R) of indium (In) of the metals in the metal ionic salt compound was different, and characteristics of the formed thin film transistor were measured, and shown in FIG. 5 to FIG. 9.

Specifically, the thin film transistor substrates including the oxide semiconductor were formed with various molar ratio (R) of indium (In) to the metals of indium (In), zinc (Zn), and tin (Sn) in the metal ionic salt compound: about 5% (case A), about 8% (case B), about 10% (case C), about 13% (case D) and about 20% (case E).

Herein, R is as follows.

$$R[\text{mol }\%] = \frac{[In]}{[In + Zn + Sn]} \times 100$$

Figure 5:
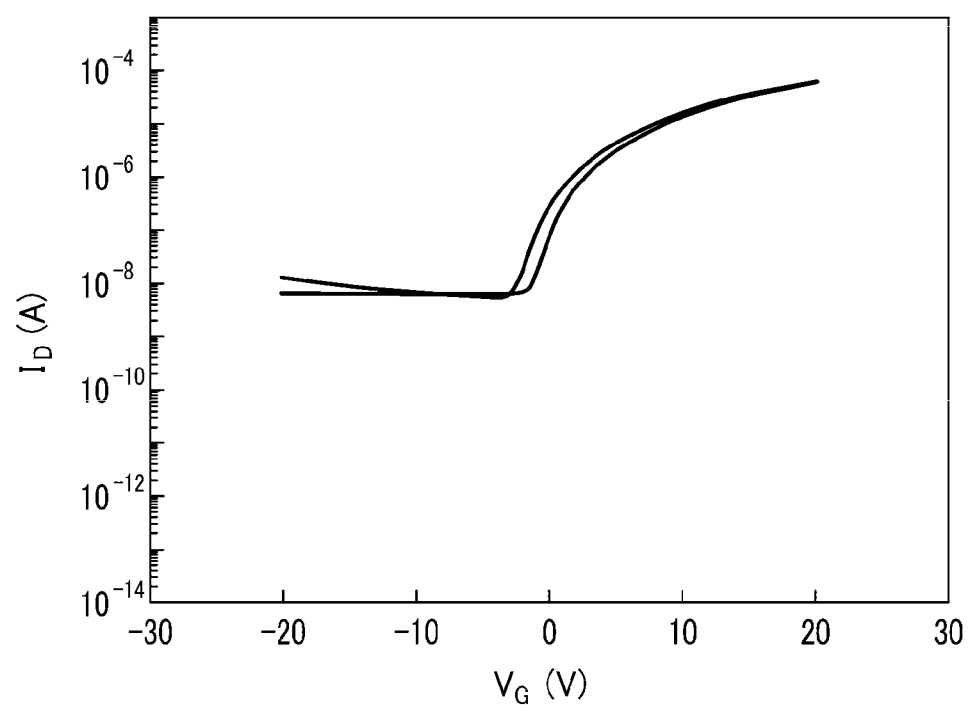
FIG. 5 to FIG. 9 are graphs illustrating a transfer curve of a thin film transistor according to other Experimental Examples of the present invention.

First, in the case where the molar ratio (R) of indium (In) of the metals in the metal ionic salt compound was about 5% (case A), charge mobility was about 1.887 cm²/Vs, and the on-off current ratio ($I_{on}/I_{off}$) was about 1E+4 referring to FIG. 5. The amount of charge flowing on the surface of the semiconductor was large because the semiconductor layer was not patterned in the present Experimental Example, but if the semiconductor layer is patterned in a predetermined size to form the semiconductor pattern, the amount of charge flowing on the surface of the semiconductor is reduced, and the value of the off-current is further reduced, such that the on-off current ratio can have a value of about $10^7$ or more.

Figure 6:
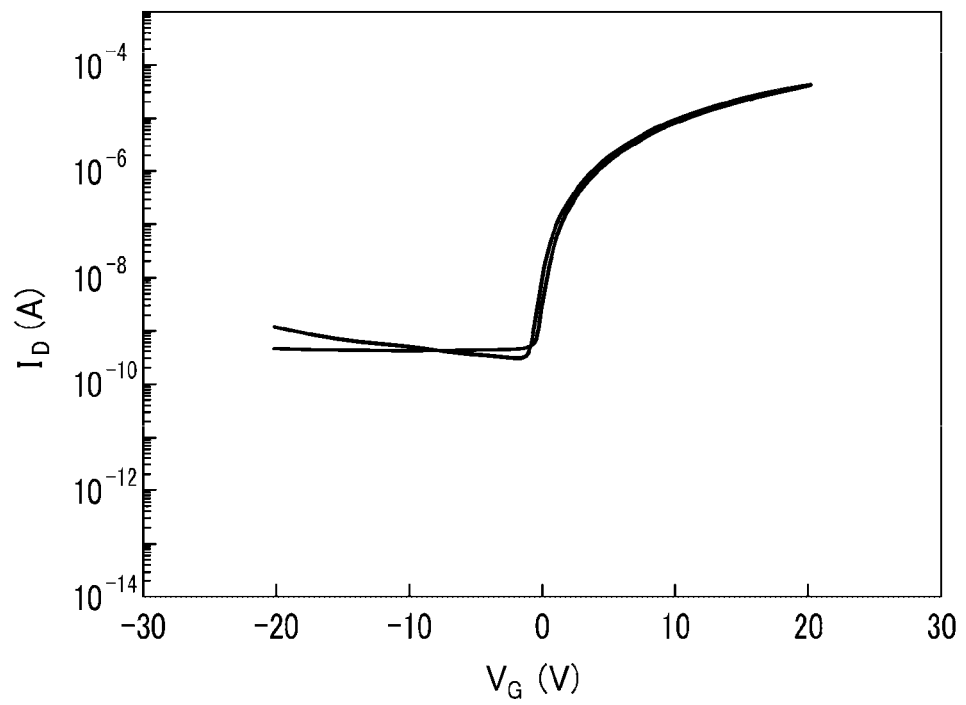
Figure 7:
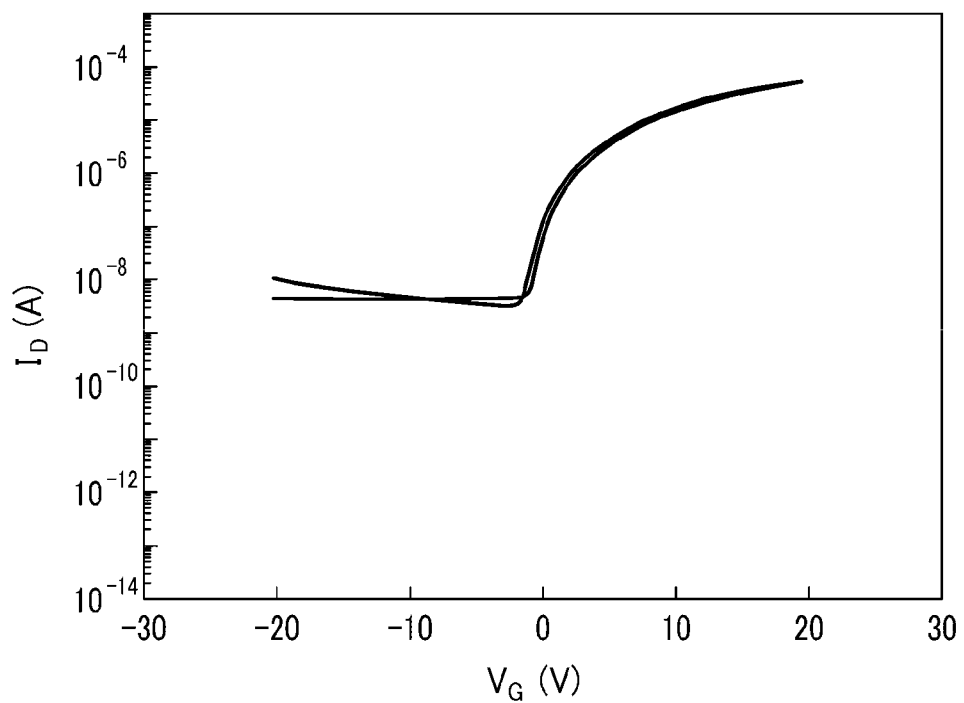

Next, in the case where the molar ratio (R) of indium (In) of the metals in the metal ionic salt compound was about 8% (case B), charge mobility was about 2.105 cm²/Vs, and the on-off current ratio ($I_{on}/I_{off}$) was about 1E+3 referring to FIG. 6. The amount of charge flowing on the surface of the semiconductor was large because the semiconductor layer was not patterned in the present Experimental Example, but if the semiconductor layer is patterned in a predetermined size to form the semiconductor pattern, the amount of charge flowing on the surface of the semiconductor is reduced, and the value of the off-current is further reduced, such that the on-off current ratio can have a value of about $10^7$ or more.

Next, in the case where the molar ratio (R) of indium (In) of the metals in the metal ionic salt compound was about 10% (case C), charge mobility was about 4.027 cm²/Vs, and the on-off current ratio ($I_{on}/I_{off}$) was about 2E+4 referring to FIG.

7. The amount of charge flowing on the surface of the semiconductor was large because the semiconductor layer was not patterned in the present Experimental Example, but if the semiconductor layer is patterned in a predetermined size to form the semiconductor pattern, the amount of charge flowing on the surface of the semiconductor is reduced, and the value of the off-current is further reduced, such that the on-off current ratio can have a value of about $10^7$ or more.

Figure 8:
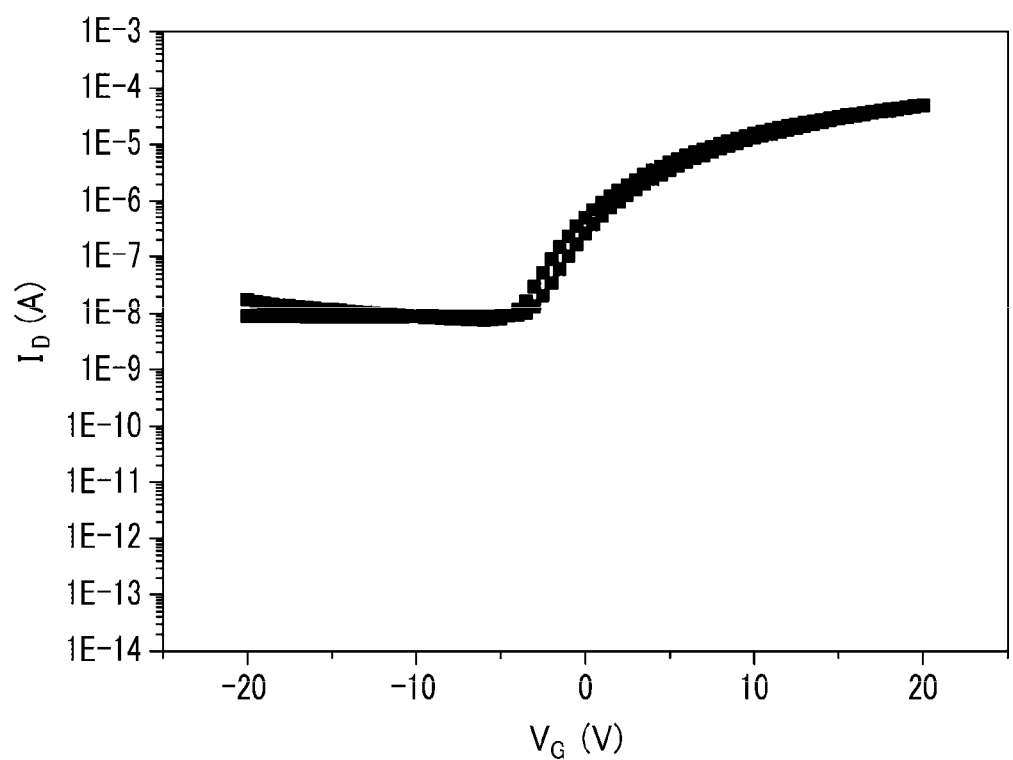

Next, in the case where the molar ratio (R) of indium (In) of the metals in the metal ionic salt compound was about 13% (case D), charge mobility was about 2.175 cm$^2$/Vs, and the on-off current ratio ($I_{on}/I_{off}$) was about 6E+3 referring to FIG. 8. The amount of charge flowing on the surface of the semiconductor was large because the semiconductor layer was not patterned in the present Experimental Example, but if the semiconductor layer is patterned in a predetermined size to form the semiconductor pattern, the amount of charge flowing on the surface of the semiconductor is reduced, and the value of the off-current is further reduced, such that the on-off current ratio can have a value of about $10^7$ or more.

Figure 9:
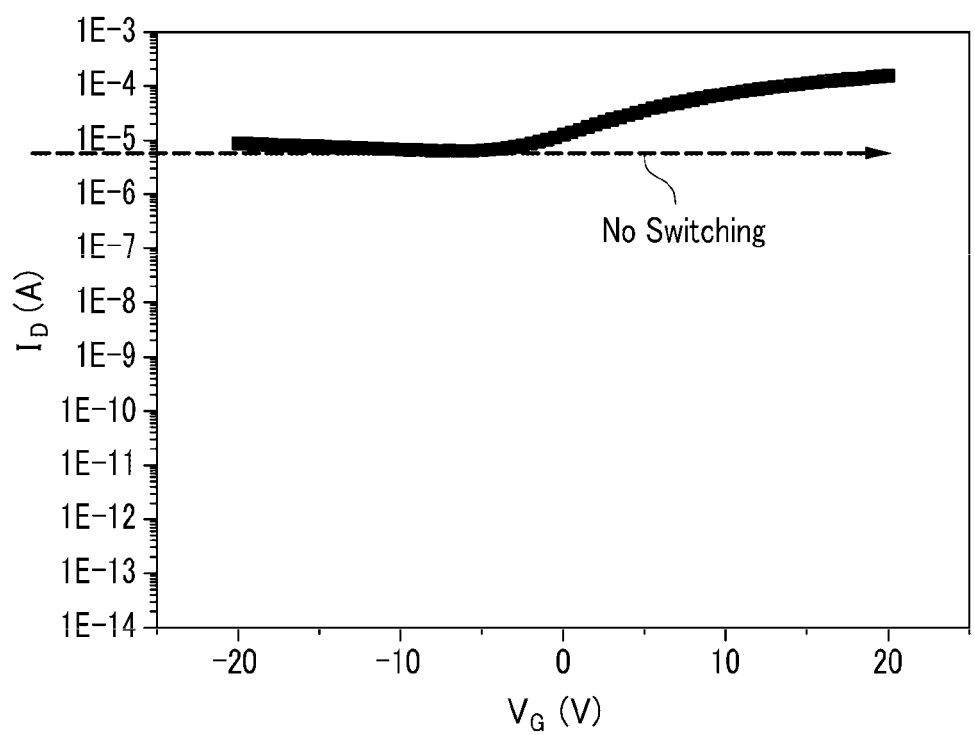

Next, in the case where the molar ratio (R) of indium (In) of the metals in the metal ionic salt compound was about 20% (case E), since the on-off current ratio ($I_{on}/I_{off}$) was about 1E+01 referring to FIG. 9, it could be seen that a switching function was not possible.

Further, although not shown in the drawings, if the molar ratio (R) of indium (In) of the metals in the metal ionic salt compound was less than about 5%, since charge mobility is too low, it could be seen that the oxide semiconductor could be used as the active layer of the thin film transistor.

Likewise, in the case where, like the thin film transistor substrate and the method of manufacturing the thin film transistor substrate according to the exemplary embodiment of the present invention, the oxide semiconductor including the metal formed of indium (In), zinc (Zn), and tin (Sn) was formed as the active layer of the thin film transistor through Experimental Example 2 and the molar ratio (R) of indium (In) in the oxide semiconductor layer 250 was less than 20%, and more specifically about 5.0% to about 13.0%, it could be seen that the on-off current ratio and charge mobility for ensuring operation as the switching element could be obtained.

Herein, R is as follows.

$$R[\text{mol }\%] = \frac{[In]}{[In + Zn + Sn]} \times 100$$

Therefore, according to the exemplary embodiments of the present invention, it is possible to provide a thin film transistor substrate formed without a costly additive by a low temperature process to have a thin film transistor characteristic by forming an oxide semiconductor including metal of indium (In), zinc (Zn), and tin (Sn) and controlling a ratio of indium in the oxide semiconductor, and a method of manufacturing the same.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 110, 210: Insulating substrate | 120, 220: Gate electrode |
| 130, 230: Gate insulating layer | 144, 244: Source electrode |
| 146, 246: Drain electrode | 150, 250: Oxide semiconductor layer |

What is claimed is:

1. A method of manufacturing a thin film transistor substrate, comprising:
    preparing a precursor composition solution of an oxide semiconductor including a precursor composition of the oxide semiconductor and a solvent,
    applying the precursor composition solution of the oxide semiconductor to a substrate, and
    heat treating the applied precursor composition solution of the oxide semiconductor,
    wherein the metal in the precursor composition of the oxide semiconductor comprises indium (In), zinc (Zn), and tin (Sn), and
    a molar ratio $$\left(R, R[\text{mol }\%] = \frac{[In]}{[In + Zn + Sn]} \times 100\right)$$

of indium (In) of the metals in the precursor composition of the oxide semiconductor is about 5% to about 13%.

2. The method of manufacturing a thin film transistor substrate of claim 1, wherein:
    the heat treating is performed at about 100° C. to about 300° C.

3. The method of manufacturing a thin film transistor substrate of claim 2, wherein:
    the heat treating is performed at about 100° C. to about 250° C.

4. The method of manufacturing a thin film transistor substrate of claim 3, wherein:
    the substrate is flexible.

5. The method of manufacturing a thin film transistor substrate of claim 4, wherein:
    the substrate includes plastics.

6. The method of manufacturing a thin film transistor substrate of claim 1, further comprising:
    patterning the heat treated precursor composition of the oxide semiconductor to form an oxide semiconductor pattern,
    forming a gate electrode overlapping the semiconductor pattern, and
    forming a source electrode and a drain electrode on the substrate.

7. The method of manufacturing a thin film transistor substrate of claim 6, wherein:
    the forming of the gate electrode forms a gate line connected to the gate electrode simultaneously, and
    the forming of the source electrode and the drain electrode forms a data line connected to the source electrode simultaneously, and the method further includes
    forming a pixel electrode electrically connected to the drain electrode.

8. The method of manufacturing a thin film transistor substrate of claim 1, wherein:
    a total molar concentration of the metals in the metal compound solution is about 0.05 M to about 1.0 M.

* * * * *